US008823001B2

(12) United States Patent
Zhang (10) Patent No.: US 8,823,001 B2
(45) Date of Patent: Sep. 2, 2014

(54) THIN FILM TRANSISTOR ARRAY SUBSTRATE AND METHOD FOR MANUFACTURING THE SAME

(75) Inventor: Yunqi Zhang, Beijing (CN)

(73) Assignees: Boe Technology Group Co., Ltd., Beijing (CN); Hefei Boe Optoelectronics Technology Co., Ltd., Hefei, Anhui (CN)

( * ) Notice: Subject to any disclaimer, the term of this patent is extended or adjusted under 35 U.S.C. 154(b) by 0 days.

(21) Appl. No.: 13/491,963

(22) Filed: Jun. 8, 2012

(65) Prior Publication Data

US 2012/0313101 A1 Dec. 13, 2012

(30) Foreign Application Priority Data

Jun. 10, 2011 (CN) .......................... 2011 1 0155543

(51) Int. Cl.
*H01L 29/04* (2006.01)
*H01L 29/10* (2006.01)

(52) U.S. Cl.
USPC ............... 257/59; 257/347; 257/88; 257/610; 257/611; 257/612; 438/706; 438/30; 438/38; 438/133; 438/160

(58) Field of Classification Search
CPC .............. H01L 27/1214; H01L 29/786; H01L 29/66742; H01L 27/3262; H01L 31/0232; H01L 21/336; H01L 27/1288
USPC .......... 257/59, 347, 88; 438/706, 30, 38, 133, 438/160
See application file for complete search history.

(56) References Cited

U.S. PATENT DOCUMENTS

| 7,172,915 B2* | 2/2007 | Lin et al. .......................... 438/38 |
| 2002/0106825 A1* | 8/2002 | Lee et al. ......................... 438/30 |
| 2005/0122458 A1* | 6/2005 | Yang .............................. 349/139 |
| 2006/0060849 A1 | 3/2006 | Kim et al. |
| 2007/0269936 A1* | 11/2007 | Tanaka et al. ................. 438/133 |
| 2007/0269988 A1* | 11/2007 | Chi et al. ...................... 438/706 |

(Continued)

FOREIGN PATENT DOCUMENTS

CN 102023401 A 4/2011

OTHER PUBLICATIONS

First Chinese Office Action dated Jul. 29, 2013; Appln. No. 2011101555437.

(Continued)

*Primary Examiner* — Fernando L Toledo
*Assistant Examiner* — Mohammed Shamsuzzaman
(74) *Attorney, Agent, or Firm* — Ladas & Parry LLP (57) ABSTRACT

The present disclosure discloses a method for manufacturing a TFT array substrate, comprising: depositing a gate metal layer, a gate insulating layer, a semiconductor layer and a source-drain electrode layer in this order on a base substrate, performing a first photolithograph process to form a common electrode line, a gate line, a gate electrode, a source electrode, a drain electrode and a channel defined between the source electrode and the drain electrode; depositing a passivation layer, performing a second photolithograph process to form a first via hole and a second via hole in the passivation layer; and depositing a pixel electrode layer and a data line layer in this order, perform a third photolithograph process to form a data line connected to the source electrode through the first via hole and a pixel electrode connected to the drain electrode through the second via hole.

13 Claims, 9 Drawing Sheets

(56) References Cited

U.S. PATENT DOCUMENTS

2007/0298554 A1* 12/2007 Long et al. .................. 438/160
2008/0173870 A1* 7/2008 Kim et al. .................... 257/59
2009/0141222 A1* 6/2009 Hsu et al. .................... 349/114

OTHER PUBLICATIONS

Second Chinese Office Action dated May 6, 2014; Appln. No. 201110155543.7.

* cited by examiner

THIN FILM TRANSISTOR ARRAY SUBSTRATE AND METHOD FOR MANUFACTURING THE SAME

BACKGROUND

One or more embodiments of the present disclosure relate to a method for manufacturing a thin film transistor (TFT) array substrate and a TFT array substrate.

For purpose of reducing the costs and increasing the yield of thin film transistor liquid crystal displays (TFT-LCDs), the methods for manufacturing the TFT array substrate have been simplified significantly, and a 4-Mask process is typically employed.

Generally, the 4-Mask process refers to a method for manufacturing a TFT array substrate by using four patterning processes. Specifically, the first patterning process is used for forming gate lines and common electrode lines; the second patterning process is used for forming data lines and primary configuration of TFTs; the third patterning process is used for removing the passivation layer formed above a drain electrodes of a TFT so as to connect a pixel electrode to be formed and the drain electrodes; and the four patterning process is used for forming the pixel electrode. Accordingly, the 4-Mask process has defects such as complexity of producing process, high costs and long producing period.

SUMMARY

According to the first aspect of the disclosure, a method for manufacturing a thin film transistor (TFT) array substrate is provided. The method comprises: depositing a gate metal layer, a gate insulating layer, a semiconductor layer and a source-drain electrode layer in this order on a base substrate, performing a first photolithograph process, and form common electrode lines, gate lines, a gate electrode, a source electrode, a drain electrode and a channel defined between the source electrode and the drain electrode; depositing a passivation layer, perform a second photolithograph process, and form a first via hole in the passivation layer located above the source electrode and a second via hole in the passivation layer located above the drain electrode; depositing a pixel electrode layer and a data line layer in this order, perform a third photolithograph process, and form a data line which is connected to the source electrode through the first via hole and a pixel electrode which is connected to the drain electrode through the second via hole.

According to the second aspect of the disclosure, a thin film transistor (TFT) array substrate is provided. The TFT array substrate comprises: a base substrate, a common electrode line, a gate line and a gate electrode formed on the base substrate; a gate insulating layer formed above the common electrode line, the gate line and the gate electrode; a semiconductor layer formed above the gate insulating layer located on the gate electrodes; a source electrode and a drain electrode formed above the semiconductor layer with a channel defined between the source electrode and the drain electrode; a passivation layer formed above the devices; a first via hole formed in the passivation layer located above the source electrode; a second via hole formed in the passivation layer located above the drain electrode; a data line which is connected to the source electrode through the first via hole; and a pixel electrode which is connected to the drain electrode through the second via hole.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein.

DETAILED DESCRIPTION

Hereinafter, one or more embodiments of the disclosure will be described in detail with reference to the accompanying drawings so that the objects, technical solutions and advantages of the embodiments of the disclosure will become more apparent. It should be noted that the embodiments described below merely are a portion of but not all of the embodiments of the disclosure, and thus various modifications, combinations and alterations can be made on basis of the described embodiments without departing from the spirit and scope of the disclosure. In the disclosure, "a" and "an" means at least one.

In an embodiment of the disclosure, a 3-Mask process is employed to manufacture a thin film transistor (TFT) array substrate. In this case, as compared with the conventional 4-Mask process, it is possible to reduce the number of processes, decrease the producing costs, and increase the producing efficiency.

Figure 1:
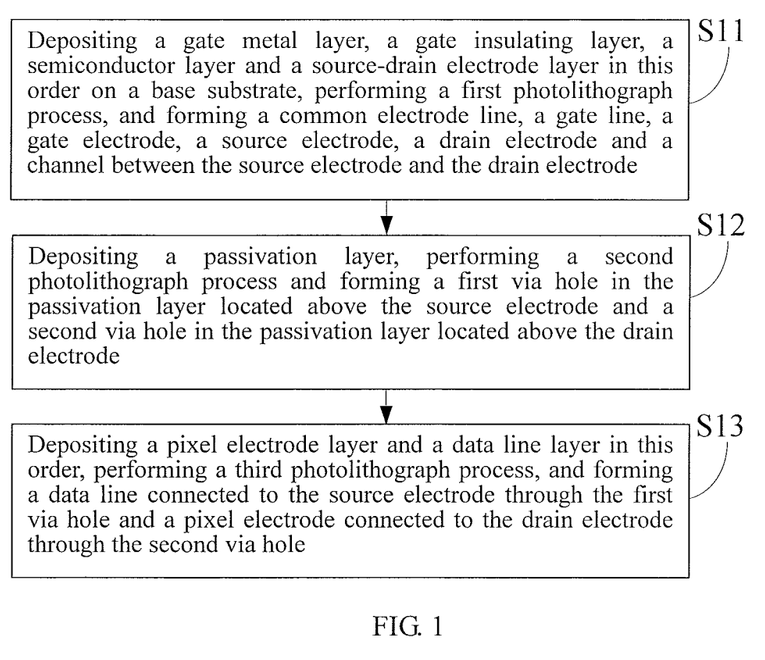
FIG. 1 is a flow diagram showing a method for manufacturing a TFT array substrate in an embodiment of the disclosure.

Below a method for manufacturing a TFT array substrate will be described with reference to FIG. 1 according to an embodiment of the disclosure. FIG. 1 is a flow diagram showing the method for manufacturing a TFT array substrate in the embodiment of the disclosure. For example, as shown in FIG. 1, the method for manufacturing a TFT array substrate in the embodiment of the disclosure comprises several steps which will be described in detail.

Firstly, a gate metal layer, a gate insulating layer, a semiconductor layer and a source-drain electrode layer are deposited in this order on a base substrate, a first photolithograph process is performed, and a common electrode line, a gate line, a gate electrode, a source electrode, a drain electrode and a channel defined between the source electrode and the drain electrode are formed (Step S11) for one pixel unit.

In the embodiment of the disclosure, the step S11 may comprise (but not limited to) a plurality of sub-steps (e.g., A1 to A5 which will be described in detail below). In the step S11, for example, a three-tone photo mask may be employed during the exposing process of photoresist for the first photolithograph, and such a mask may have three regions have different transmissivity besides a blocking region (opaque region). After the applied photoresist is exposed with the three-tone photo mask, a developing process is performed. As a result, a photoresist pattern comprising three photoresist areas, which have different thicknesses from each other, can be obtained, and the obtained photoresist pattern can be used during for etching (pattering) a underlying layer or film subsequently. Furthermore, the photoresist pattern can be thinned by an ashing process so as to remove the area with a smaller thickness so as to generate a new photoresist patter for another etching.

Here the step S11 will be described in detail with reference to FIGS. 2 to 5B.

Figure 2:
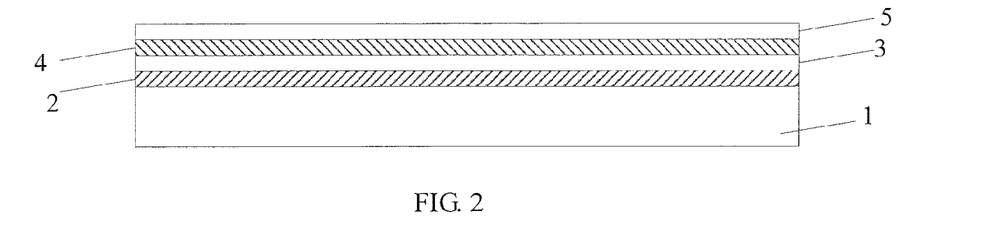
FIG. 2 is a cross-sectional schematic diagram showing the deposition of a gate metal layer, a gate insulating layer, a semiconductor layer and a source-drain electrode layer (a sub-step A1 in a step S11) in the embodiment of the disclosure.

In the sub-step A1, a gate metal layer 2, a gate insulating layer 3, a semiconductor layer 4 and a source-drain electrode layer 5 are deposited in this order on a base substrate 1 (as shown in FIG. 2); then, a first photolithograph process (comprising forming a photoresist layer, exposing and developing the photoresist layer, etc.) is performed by using a first photo mask. The first photo mask may be a three-tone photo mask, and thus a photoresist pattern comprising three areas, each of which has a thickness different from that of the others, can be obtained as an etching mask.

Figure 3:
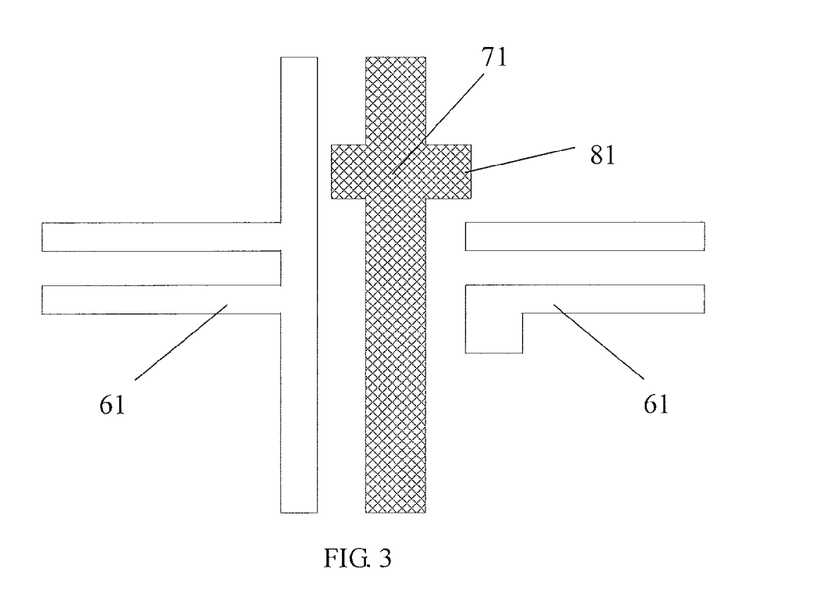
FIG. 3 is a plan schematic diagram showing the formation of a common electrode line pattern, a gate line pattern and a gate electrode pattern (a sub-step A2 in the step S11) in the embodiment of the disclosure.

In the sub-step A2, an etching process is performed to form a common electrode line pattern 61, a gate line pattern 71 and a gate electrode pattern 81 (as shown in FIG. 3). Then, for example, an ashing process is performed to remove the photoresist in the areas corresponding to the common electrode line pattern and the gate line pattern.

Next, in the sub-step A3, the source-drain electrode layer 5 and the semiconductor layer 4 in the common electrode line pattern and the gate line pattern are etched away in this order, thus the common electrode lines 6 and the gate lines 7 are formed, and at the same time a semiconductor island located above the gate electrode are obtained.

Figure 4A:
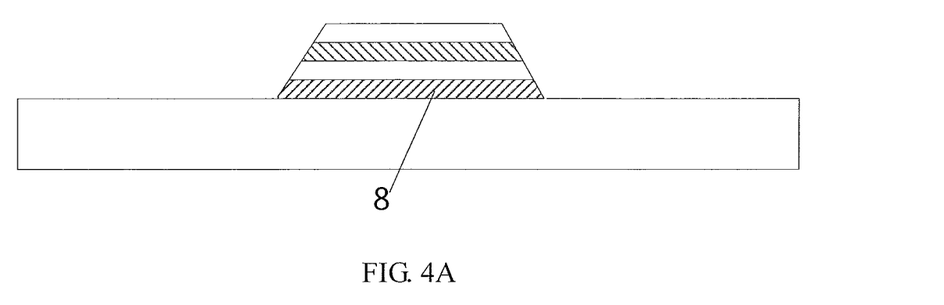
FIGS. 4A and 4B are a cross-sectional schematic diagram and a plan schematic diagram showing the formation of a gate electrode (sub-steps A3 to A4 in the step S11) in the embodiment of the disclosure.
Figure 4B:
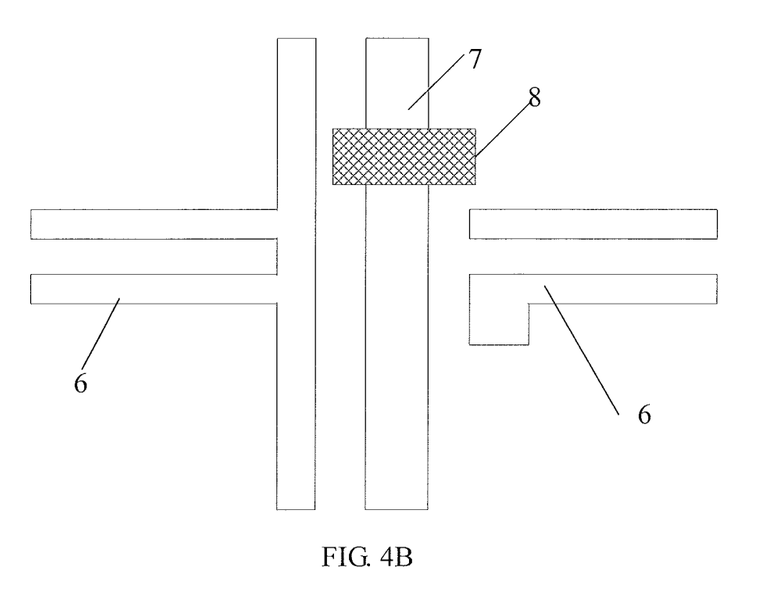

In the sub-step A4, the source-drain electrode layer 5, the semiconductor layer 4 and the gate insulating layer 3 located in the gate electrode pattern are etched so that the source-drain electrode layer 5, the semiconductor layer 4 and the gate insulating layer 3 located in stack in the gate electrode pattern can have a trapezium-shaped profile or cross-section (as shown in FIGS. 4A and 4B, in which the gate electrode 8 and the gate line 7 are formed integrally). Then, an ashing process is performed again on the photoresist pattern so as to remove the photoresist in the area corresponding to the channel of the thin film transistor (TFT).

Figure 5A:
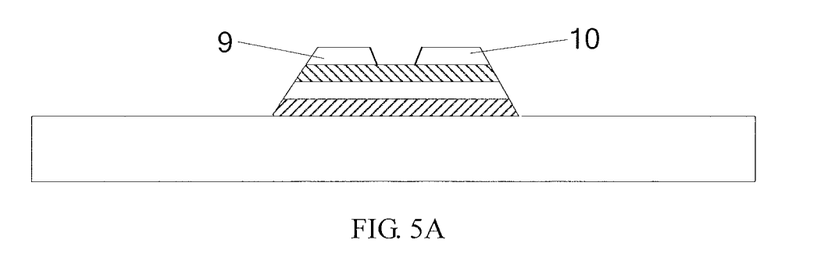
FIGS. 5A and 5B are a cross-sectional schematic diagram and a plan schematic diagram showing the formation of a source electrode, a drain electrode and a channel therebetween (a sub-step A5 in the step S11) in the embodiment of the disclosure.
Figure 5B:
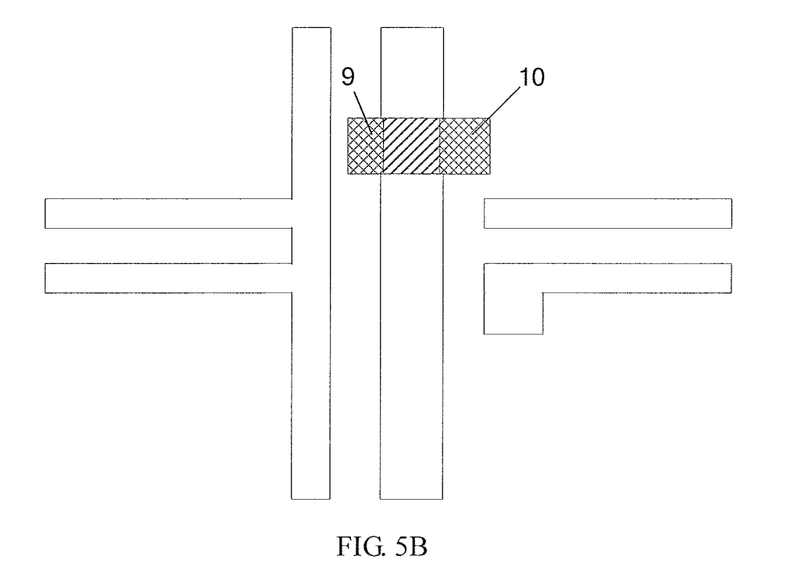

In the sub-step A5, the source-drain electrode layer of the semiconductor island located above the gate electrode pattern is etched to form the channel and the source electrode 9 and the drain electrode 10 located on both sides of the channel (as shown in FIGS. 5A and 5B).

Figure 6:
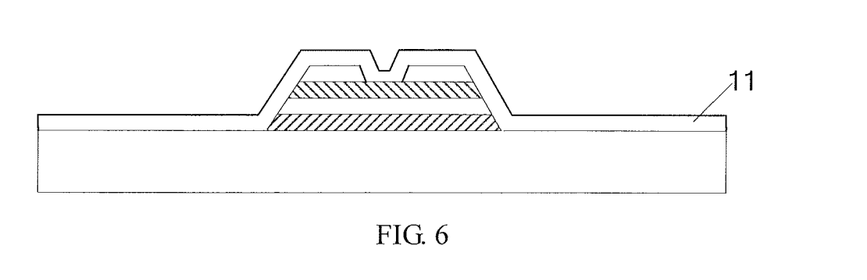
FIG. 6 is a cross-sectional schematic diagram showing the deposition of a passivation layer (a step S12) in the embodiment of the disclosure.
Figure 7A:
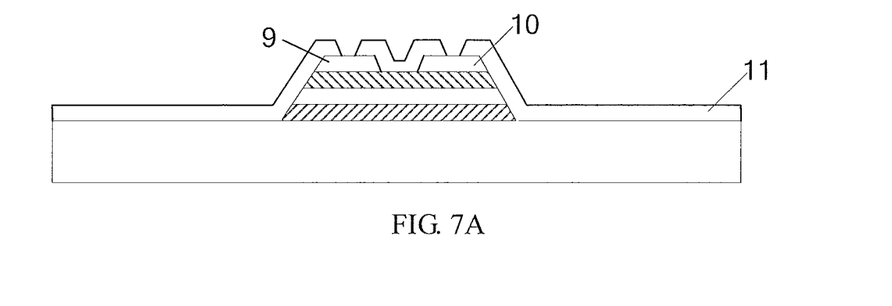
FIGS. 7A and 7B are a cross-sectional schematic diagram and a plan schematic diagram showing the formation of via holes (a step S12) in the embodiment of the disclosure.
Figure 7B:
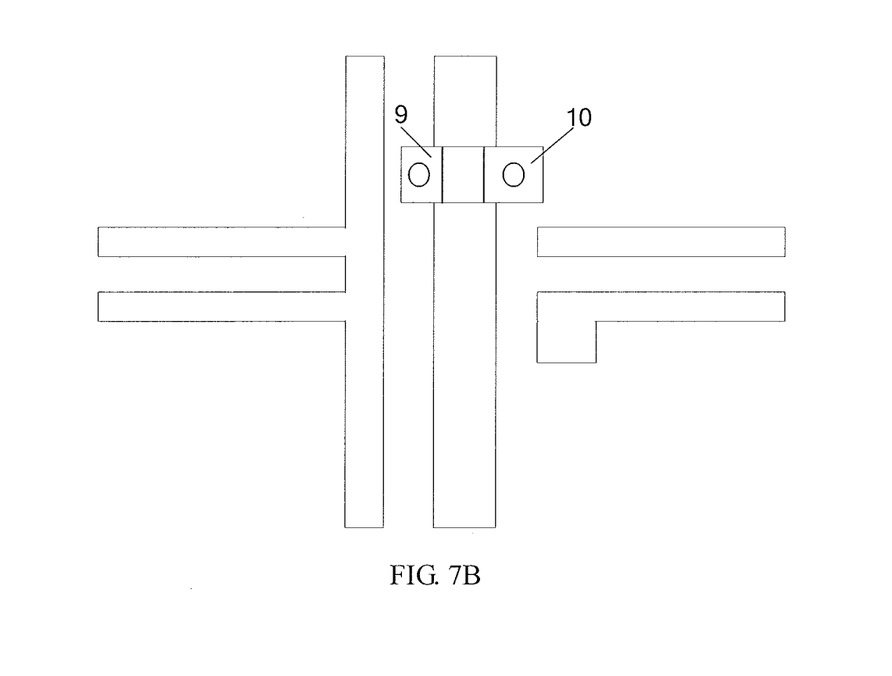

Next, as shown in FIG. 6, a passivation layer 11 is deposited on the surface of the base substrate 1 (including the common electrode line 6, the gate line 7, and the gate electrode 8, the source electrode 9, the drain electrode 10, and the channel of the TFT); then, as shown in FIGS. 7A and 7B, a second photolithograph process (comprising forming a photoresist layer, exposing and developing the photoresist layer, etc.) is performed by using a second photo mask, a first via hole is formed in the passivation layer 11 above the source electrode 9 by etching and a second via hole is formed in the passivation layer 11 above the drain electrode 10 by etching (Step S12). The second photo mask may be a normal single-tone photo mask having one transparent or translucent region, by which the photoresist is exposed and then developed to obtain a photoresist pattern having only one thickness.

The first via hole is used for connection of the data lines which will be deposited later, and the second via hole is used for connection of the pixel electrode which will be deposited later.

Next, a pixel electrode layer and a data line layer are deposited in this order on the base substrate 1, and then a third photolithograph process is performed to form a data line which is connected to the source electrode through the first via hole and a pixel electrode which is connected to the drain electrode through the second via hole (Step S13).

Figure 8:
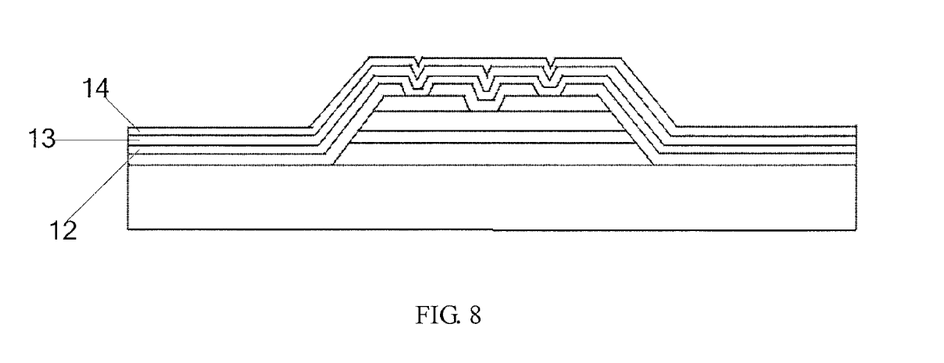
FIG. 8 is a cross-sectional schematic diagram showing the deposition of a pixel electrode layer and a data line layer (a sub-step B1 in a step S13) in the embodiment of the disclosure.
Figure 9A:
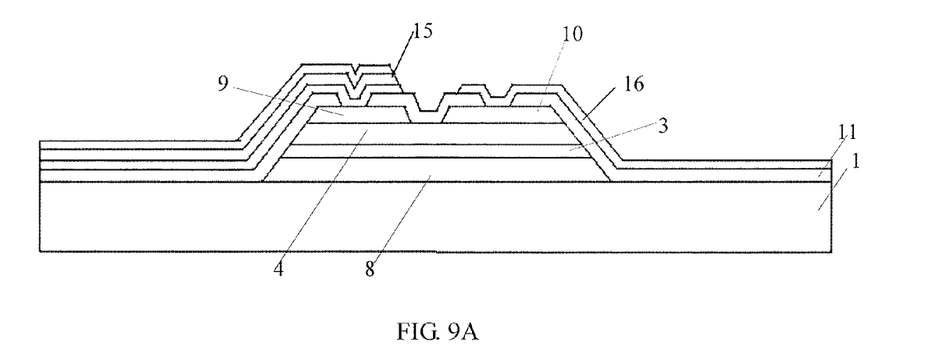
FIGS. 9A and 9B are a cross-sectional schematic diagram and a plan schematic diagram showing the formation of data lines and pixel electrodes (sub-steps B2 to B3 in the step S13) in the embodiment of the disclosure.

In the embodiment of the disclosure, the step S13 may comprise (but not limited to) a plurality of sub-steps (e.g., B1 to B3 which will be described in detail below). The step S13 will be described in detail with reference to FIGS. 8 to 9B.

In the sub-step B1, a pixel electrode layer 12 and a data line layer 13, 14 are deposited in this order, and then a third photolithograph process (comprising forming a photoresist layer, exposing and developing the photoresist layer, etc.) is performed by using a third photo mask. For example, as shown in FIG. 8, the data line layer may include a data metal layer 13 and an indium tin oxide (ITO) layer 14, but the embodiment of the disclosure is not limited hereto. The ITO layer 14 functions to prevent the data lines from being oxidized, and thus the ITO layer 14 can be substituted with another anti-oxidation material layer. The third photo mask may be a dual-tone photo mask such as a grey tone mask or half tone mask, by which the photoresist is exposed and developed to obtain a photoresist pattern having two areas, each of which has a thickness different from that of the other.

In the sub-step B2, the pixel electrode layer 12 and the data line layer (including the data metal layer 13 and the ITO layer 14) are etched, and a pixel electrode pattern and a data line 15 are formed, and the data line 15 is connected to the source electrode 9 through the first via hole.

Subsequently, an ashing process is performed to the photoresist pattern to remove the photoresist in the area corresponding to the pixel electrode pattern.

Figure 9B:
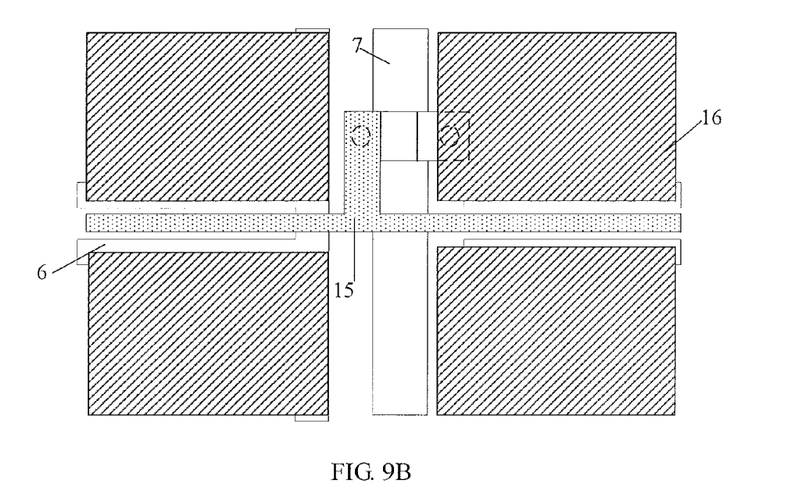

In the sub-step B3, as shown in FIGS. 9A and 9B, the data line layer located above the pixel electrode pattern is etched away to form a pixel electrode 16 which is connected to the drain electrode 10 through the second via hole.

In some embodiment of the disclosure, for purpose of realizing the interconnection of the common electrode lines, facilitating the reparation of the deficiencies such as gate line opening (GO) and the like, in the step S12, additional via holes are formed in the passivation layer located above two adjacent common electrode lines along with the first via hole and the second via hole are formed; furthermore, in the step S13, a common electrode interconnection line, which connects the two adjacent common electrode lines through the additional via holes, is formed, when the data line is formed.

Figure 10A:
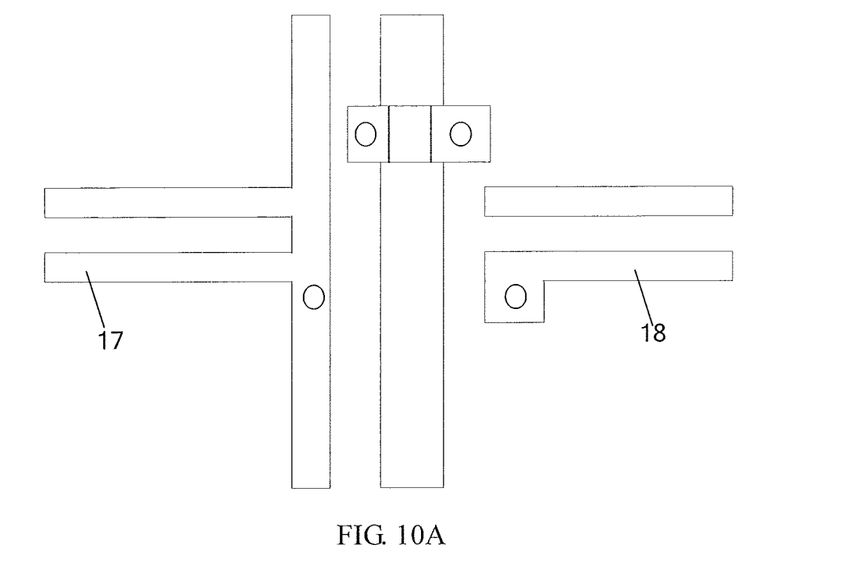
FIG. 10A is a plan schematic diagram showing via holes formed in adjacent common electrode lines in the embodiment of the disclosure.
Figure 10B:
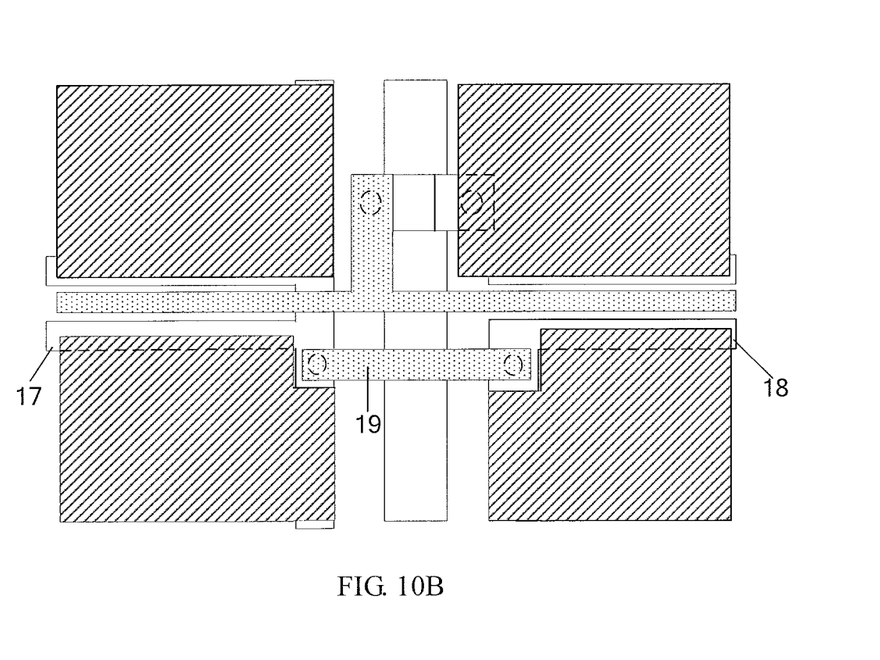
FIG. 10B is a plan schematic diagram showing the common electrode lines connected by common electrodes in the embodiment of the disclosure.

For example, FIGS. 10A and 10B (in which the pixel electrode is not shown) show a first common electrode line 17 and a second common electrode line 18 adjacent to each other. In the step S12, when the first via hole and the second via hole are formed, a third via hole is formed in the passivation layer 11 located above the first common electrode line 17 and a fourth via hole is formed in the passivation layer 11 located above the second common electrode line 18; furthermore, in the step S13, while the data line 16 is formed, a common electrode interconnection line 19, which has one end connected through the third via hole and the other end connected through the four via hole, is formed.

It is possible to form the common electrode lines on the base substrate in manner of network interconnection by using the common electrode interconnection lines. Therefore, the deficiencies such as GO can be repaired by means of the common electrode lines, without common open (CO) being generated.

In this example, the base substrate 1 may be a glass substrate, a quartz substrate, a plastic substrate or the like.

For example, the raw materials for depositing the gate insulating layer 3 may be $SiH_4$, $NH_3$ and $N_2$; the raw materials for depositing the semiconductor layer 4 may be $SiH_4$ and $H_2$; the raw materials for depositing the source-drain electrode layer 5 may be $SiH_4$, $PH_3$ and $H_2$; and the raw materials for depositing the passivation layer 11 may be $SiH_4$, $NH_3$ and $N_2$.

The gate metal layer 2 and/or the data metal layer 13 may be a single layer made of one metal selected from the group consisting of Cr, W, Ti, Ta, Mo, Al and Cu. In another example, the gate metal layer 2 and/or the data metal layer 13 may be in a composite layer including two or more metals selected from the group consisting of Cr, W, Ti, Ta, Mo, Al and Cu. The agent for etching the gate metal layer 2 and/or the data metal layer 13 may be phosphoric acid, acetic acid, and nitric acid.

The pixel electrode layer 12 may be an indium tin oxide layer, an indium zinc oxide layer or any other electrode material layer. The agent for etching the pixel electrode layer 12 can be sulfuric acid, acetic acid, and nitric acid.

The gate insulating layer 3 and the passivation layer 11 may be an insulating oxide layer, an insulating nitride layer, an insulating oxynitride layer or any other insulating material layer. In one example, the passivation layer 11 has an insulating property higher than that of the gate insulating layer 3. The semiconductor layer 4 may be a hydrogenated amorphous silicon layer (a-Si:H), a polysilicon layer or any other semiconductor material layer. The source-drain electrode layer 5 may be N+ amorphous silicon layer (N+ a-Si:H), a doped polysilicon layer or any other semiconductor material layer. The gases for etching the gate insulating layer 3, the semiconductor layer 4, the source-electrode layer 5 and the passivation layer 11 may be $Cl_2$ and $SF_6$.

In the embodiment of the disclosure, the materials of the respective layers, the depositing method, the raw materials for depositing and the agents for etching can be selected according to the actual requirements, and are not limited to those as described above.

In the following, the 3-Mask process in the embodiment of the disclosure and the conventional 4-Mask process will be compared in the following Tables 1 and 2. Table 1 shows schematically the 3-Mask process disclosed in the above embodiment of the disclosure, and Table 2 shows schematically the 4-Mask process in the prior art.

It can be known from the comparison from Tables 1 and 2 that, in the 3-Mask process disclosed in the embodiment of the disclosure, the deposition sequence of the layers are adjusted so as to realize the 3-Mask process for manufacturing the TFT array substrate, which reduces the number of the processes, decreases the production costs and increases the production efficiency, as compared with the conventional 4-Mask process.

TABLE 1 the 3-Mask process of the disclosure

| 3-Mask process of the disclosure | The layers to be formed and patterned |
| --- | --- |
| First photolithograph process | The gate metal layer |
|  | The gate insulating layer |
|  | The semiconductor layer |
|  | The source-drain electrode layer |
| Second photolithograph process | The passivation layer |
| Third photolithograph process | The pixel electrode layer |
|  | The data line layer |

TABLE 2

Conventional 4-Mask process of the disclosure

| Conventional 4-Mask process | The layers to be formed and patterned |
| --- | --- |
| First photolithograph process | The gate metal layer |
| Second photolithograph process | The gate insulating layer |
|  | The semiconductor layer |
|  | The ohm contact layer |
|  | The data line layer |
| Third photolithograph process | The passivation layer |
| Fourth photolithograph process | The pixel electrode layer |

In addition, a TFT array substrate manufactured by the above manufacturing method provided in the embodiment of the disclosure is also provided.

For example, as shown in FIGS. 9A and 9B, the TFT array substrate provided in the embodiment of the disclosure can from the bottom up comprise:

the base substrate 1;

the common electrode line 6, the gate line 7, and the gate electrode 8 formed integrally with the gate line 7, which are formed above the base substrate 1;

the gate insulating layer 3 formed above the common electrode 6, the gate line 7 and the gate electrode 8;

the semiconductor layer 4 formed above the gate insulating layer 3 on the gate electrode 8;

the source electrode 9 and the drain electrode 10 formed on the semiconductor layer 4, with a channel being defined between the source electrode and the drain electrode, and having a trapezium-shaped cross-section;

the passivation layer 11 formed above the respective components;

the first via hole formed in the passivation layer above the source electrode 9, and the second via hole formed in the passivation layer above the drain electrode 10; and the data line 15 connected to the source electrode 9 through the first via hole, and the pixel electrode 16 connected to the drain electrode 10 through the second via hole.

In addition, in another embodiment of the disclosure, for purpose of realizing the interconnection of adjacent common electrode lines, facilitating the reparation of the deficiencies such as GO and the like; as shown in FIGS. 10A and 10B, the exemplary common electrode lines can include the first common electrode line 17 and the second common electrode line 18 adjacent to each other, and the TFT array substrate may further comprises:

a third via hole formed in the passivation layer 11 above the first common electrode line 17 (as shown in FIG. 10A);

a fourth via hole formed in the passivation layer 11 above the second common electrode line 18 (as shown in FIG. 10A); and a common electrode interconnection line 19, one end of which is connected through the third via hole, and another end of which is connected through the fourth via hole (as shown in FIG. 10B).

It is possible to form the common electrode lines in network by using the common electrode interconnection lines. Therefore, the deficiencies such as GO can be repaired by means of the common electrode lines, without common open (CO) being generated.

The structure of the TFT array substrate disclosed in the embodiment of the disclosure is not limited those as described above, and may be manufactured by a method other than the 3-Mask process provided above in the embodiment of the disclosure.

It should be appreciated that the embodiments described above are intended to illustrate but not limit the present disclosure. Although the present disclosure has been described in detail herein with reference to the preferred embodiments, it should be understood by those skilled in the art that the present disclosure can be modified and some of the technical features can be equivalently substituted without departing from the spirit and scope of the present disclosure.

What is claimed is:

1. A method for manufacturing a thin film transistor (TFT) array substrate, comprising:

depositing a gate metal layer, a gate insulating layer, a semiconductor layer and a source-drain electrode layer in this order on a base substrate, performing a first photolithograph process, and forming a common electrode line, a gate line, a gate electrode, a source electrode, a drain electrode and a channel defined between the source electrode and the drain electrode;

depositing a passivation layer, performing a second photolithograph process, and forming a first via hole in the passivation layer located above the source electrode and a second via hole in the passivation layer located above the drain electrode; and depositing stacked layers of a pixel electrode layer and a data line layer in this order, performing a third photolithograph process, and forming a data line connected to the source electrode through the first via hole and a pixel electrode connected to the drain electrode through the second via hole, wherein the step of depositing a pixel electrode layer and a data line layer in this order, performing a third photolithograph process, and forming a data line connected to the source electrode through the first via hole and a pixel electrode connected to the drain electrode through the second via hole comprises:

depositing the pixel electrode layer and the data line layer in this order, and performing the third photolithograph process by using a third photo mask;

etching the stacked layers to form a pixel electrode pattern and the data line which is connected to the source electrode through the first via hole; and etching the data line layer located above the pixel electrode pattern so as to form the pixel electrode which is connected to the drain electrode through the second via hole.

2. The method for manufacturing the TFT array substrate according to claim 1, wherein the common electrode line comprise a first common electrode line and a second common electrode line adjacent to each other, and before depositing the pixel electrode layer and the data line layer in this order, the method further comprises:

forming a third via hole in the passivation layer located above the first common electrode line and a fourth via hole in the passivation layer located above the second common electrode line.

3. The method for manufacturing the TFT array substrate according to claim 2, wherein, when forming the data line, the method further comprises:

forming a common electrode interconnection line, one end of the common electrode interconnection line being connected to the first common electrode line through the third via hole, and another end of the common electrode interconnection line being connected to the second common electrode line through the fourth via hole.

4. The method for manufacturing the TFT array substrate according to claim 1, wherein the step of depositing a gate metal layer, a gate insulating layer, a semiconductor layer and a source-drain electrode layer in this order on a base substrate, performing a first photolithograph process, and forming a common electrode line, a gate line, a gate electrode, a source electrode, a drain electrode and a channel defined between the source electrode and the drain electrode comprises:

depositing the gate metal layer, the gate insulating layer, the semiconductor layer and the source-drain electrode layer in this order on the base substrate, and performing the photolithograph by using a first photo mask;

etching the stacked layers to form a common electrode line pattern, a gate line pattern and a gate electrode pattern;

etching the semiconductor layer and the source-drain electrode layer located above the common electrode line pattern and the gate line pattern to form the common electrode line and the gate line;

etching the gate insulating layer, the semiconductor layer and the source-drain electrode layer located above the gate electrode pattern, so that the gate insulating layer, the semiconductor layer and the source-drain electrode layer located above the gate electrode pattern has a trapezium-shaped cross section; and etching the source-drain electrode layer located above the gate electrode pattern so as to form the channel, with the source electrode and the drain electrode being located on both sides of the channel.

5. The method for manufacturing the TFT array substrate according to claim 2, wherein the step of depositing a gate metal layer, a gate insulating layer, a semiconductor layer and a source-drain electrode layer in this order on a base substrate, performing a first photolithograph process, and forming a common electrode line, a gate line, a gate electrode, a source electrode, a drain electrode and a channel defined between the source electrode and the drain electrode comprises:

depositing the gate metal layer, the gate insulating layer, the semiconductor layer and the source-drain electrode layer in this order on the base substrate, and performing the photolithograph by using a first photo mask;

etching the stacked layers to form a common electrode line pattern, a gate line pattern and a gate electrode pattern;

etching the semiconductor layer and the source-drain electrode layer located above the common electrode line pattern and the gate line pattern to form the common electrode lines and the gate lines;

etching the gate insulating layer, the semiconductor layer and the source-drain electrode layer located above the gate electrode pattern, so that the gate insulating layer, the semiconductor layer and the source-drain electrode layer located above the gate electrode pattern has a trapezium-shaped cross section; and etching the source-drain electrode layer located above the gate electrode pattern so as to form the channel, with the source electrode and the drain electrode being located on both sides of the channel.

6. The method for manufacturing the TFT array substrate according to claim 3, wherein the step of depositing a gate metal layer, a gate insulating layer, a semiconductor layer and a source-drain electrode layer in this order on a base substrate, performing a first photolithograph process, and forming a common electrode line, a gate line, a gate electrode, a source electrode, a drain electrode and a channel defined between the source electrode and the drain electrode comprises:

depositing the gate metal layer, the gate insulating layer, the semiconductor layer and the source-drain electrode layer in this order on the base substrate, and performing the photolithograph by using a first photo mask;

etching the stacked layers to form a common electrode line pattern, a gate line pattern and a gate electrode pattern;

etching the semiconductor layer and the source-drain electrode layer located above the common electrode line pattern and the gate line pattern to form the common electrode lines and the gate lines;

etching the gate insulating layer, the semiconductor layer and the source-drain electrode layer located above the gate electrode pattern, so that the gate insulating layer, the semiconductor layer and the source-drain electrode layer located above the gate electrode pattern has a trapezium-shaped cross section; and etching the source-drain electrode layer located above the gate electrode pattern so as to form the channel, with the source electrode and the drain electrode being located on both sides of the channel.

7. The method for manufacturing the TFT array substrate according to claim 1, wherein the data line layer comprises a data metal layer and an anti-oxidation layer.

8. The method for manufacturing the TFT array substrate according to claim 7, wherein the pixel electrode layer is an indium tin oxide layer; and the gate metal layer and/or the data metal layer is a single layer made of one metal selected from a group consisting of Cr, W, Ti, Ta, Mo, Al and Cu.

9. The method for manufacturing the TFT array substrate according to claim 7, wherein the pixel electrode layer is an indium tin oxide layer; and the gate metal layer and/or the data metal layer is a composite layer made of two or more metals selected from a group consisting of Cr, W, Ti, Ta, Mo, Al and Cu.

10. The method for manufacturing the TFT array substrate according to claim 8, wherein an agent for etching the gate metal layer and/or the data metal layer is phosphoric acid, acetic acid and nitric acid; and an agent for etching the pixel electrode layer is sulfuric acid, acetic acid, and nitric acid.

11. The method for manufacturing the TFT array substrate according to claim 8, wherein the semiconductor layer is a hydrogenated amorphous silicon layer or a polysilicon layer; and the source-drain electrode layer is a N+ amorphous silicon layer or a doped polysilicon layer.

12. The method for manufacturing the TFT array substrate according to claim 11, wherein gases for etching the gate insulating layer, the semiconductor layer, the source-drain electrode layer and the passivation layer are Cl2 and SF6.

13. A method for manufacturing a thin film transistor (TFT) array substrate, comprising:

depositing a gate metal layer, a gate insulating layer, a semiconductor layer and a source-drain electrode layer in this order on a base substrate, performing a first photolithograph process, and forming a common electrode line, a gate line, a gate electrode, a source electrode, a drain electrode and a channel defined between the source electrode and the drain electrode;

depositing a passivation layer, performing a second photolithograph process, and forming a first via hole in the passivation layer located above the source electrode and a second via hole in the passivation layer located above the drain electrode; and depositing stacked layers of a pixel electrode layer and a data line layer in this order, performing a third photolithograph process, and forming a data line connected to the source electrode through the first via hole and a pixel electrode connected to the drain electrode through the second via hole, wherein the step of depositing a gate metal layer, a gate insulating layer, a semiconductor layer and a source-drain electrode layer in this order on a base substrate, performing a first photolithograph process, and forming a common electrode line, a gate line, a gate electrode, a source electrode, a drain electrode and a channel defined between the source electrode and the drain electrode comprises:

depositing the gate metal layer, the gate insulating layer, the semiconductor layer and the source-drain electrode layer in this order on the base substrate, and performing the photolithograph by using a three-tone photo mask;

etching the stacked layers to form a common electrode line pattern, a gate line pattern and a gate electrode pattern;

performing an ashing process to remove the photoresist in areas corresponding to the common electrode line pattern and the gate line pattern;

etching the semiconductor layer and the source-drain electrode layer located above the common electrode line pattern and the gate line pattern to form the common electrode line and the gate line;

etching the gate insulating layer, the semiconductor layer and the source-drain electrode layer located above the gate electrode pattern, so that the gate insulating layer, the semiconductor layer and the source-drain electrode layer located above the gate electrode pattern has a trapezium-shaped cross section;

performing another ashing process to remove the photoresist in area corresponding to the channel of the thin film transistor; and etching the source-drain electrode layer located above the gate electrode pattern so as to form the channel, with the source electrode and the drain electrode being located on both sides of the channel.

* * * * *